United States Patent
Wu et al.

(10) Patent No.: US 7,403,414 B2
(45) Date of Patent: Jul. 22, 2008

(54) METHOD FOR MEASURING HYSTERESIS CURVE AND ANISOTROPIC ENERGY OF MAGNETIC MEMORY UNIT

(75) Inventors: Te-Ho Wu, Yunlin (TW); Lin-Hsiu Ye, Yunlin (TW); Jia-Mou Lee, Yunlin (TW); Ming-Chi Weng, Yunlin (TW)

(73) Assignee: National Yunlin University of Science and Technology, Yunlin (TW)

( * ) Notice: Subject to any disclaimer, the term of this patent is extended or adjusted under 35 U.S.C. 154(b) by 141 days.

(21) Appl. No.: 11/529,225

(22) Filed: Sep. 29, 2006

(65) Prior Publication Data
US 2007/0217255 A1    Sep. 20, 2007

(30) Foreign Application Priority Data
Mar. 20, 2006    (TW) .............................. 95109489 A

(51) Int. Cl.
*G11C 11/00*    (2006.01)
(52) U.S. Cl. ....................................... 365/158; 365/171
(58) Field of Classification Search ................. 365/158, 365/171, 173
See application file for complete search history.

(56) References Cited

U.S. PATENT DOCUMENTS

| 5,347,485 | A | * | 9/1994 | Taguchi et al. .............. 365/171 |
| 6,946,302 | B2 | * | 9/2005 | Deak ............................. 438/3 |
| 2004/0152218 | A1 | * | 8/2004 | Deak ............................. 438/3 |

* cited by examiner

*Primary Examiner*—Son Dinh
(74) *Attorney, Agent, or Firm*—Rosenberg, Klein & Lee

(57) ABSTRACT

A method for measuring hysteresis curves and anisotropic energy of magnetic memory units is disclosed. It comprises gradually applying different magnetic fields to a single-layer or a multilayer magnetic structure (such as a MRAM memory unit) by extra ordinary Hall effect, and recording the variation of the Hall voltage to obtain the hysteresis curve and anisotropic energy with specific instruments, and calculating the individual anisotropic energy value of the magnetic material of the single-layer or the multilayer magnetic structure.

19 Claims, 4 Drawing Sheets

METHOD FOR MEASURING HYSTERESIS CURVE AND ANISOTROPIC ENERGY OF MAGNETIC MEMORY UNIT

RELATED APPLICATIONS

The present application is based on, and claims priority from, Taiwan Application Serial Number 95109489, filed Mar. 20, 2006, the disclosure of which is hereby incorporated by reference herein in its entirety.

BACKGROUND

1. Field of Invention

The present invention relates to methods for measuring hysteresis curves and anisotropic energy, and more particularly to methods for measuring hysteresis curves and anisotropic energy of multilayer magnetic memory units.

2. Description of Related Art

As applications of magnetic components for everyday life grow day-by-day, developing various kinds of magnetic materials with better physical characteristics become the trend of fashion for researchers. Measuring the hysteresis curves and anisotropic energy of magnetic materials are important for differentiating their characteristics.

Conventional methods for measuring hysteresis curves include vibrating sample magnetometer (VSM) or the Kerr rotation angle by laser beam.

The measurement principle of VSM is to vibrate the magnetic sample near the coils, and determine the magnetic properties with the corresponding magnetic flux variations.

The measuring principle of the Kerr rotation angle by laser beam is either to magnetize the magnetic material with an applied external magnetic field, or spontaneously magnetize a ferromagnetic material, which makes the refraction index of the material magnetically birefringent. That means the refraction index of right-handed and left-handed polarized light are different. The magneto-optic Kerr effect will elliptically polarize a linearly polarized laser normally incident on a sample surface. The Kerr angle is the angle between the linearly polarized light and the elliptically polarized light. The direction of the magnetic moment could be determined using the angle of the elliptically polarized light, and together with the external magnetic field, the whole hysteresis curve can be obtained.

The conventional method for measuring the anisotropic energy of a single-layer uses an applied external magnetic field along the axis parallel to the direction of the sample magnetization to obtain the coercive field of the hysteresis curve and the variation curve of magnetization per unit of the sample. A second external magnetic field is applied along the axis perpendicular to the sample magnetization, wherein the intensity of the field must be much greater than the magnetization of the sample to obtain the variation curve of the perpendicular anisotropic energy of the sample. Software is then used to calculate the value of the anisotropic energy.

The aforementioned methods can all be affected by environmental factors. The VSM method is very sensitive. Any adjustment for the position between sample and coil will cause a significant deviation for the measurement. While measuring the Kerr rotation angle, a slight deviation regarding the pathway, intensity, or angle for the laser beam could also create some difficulty. The present invention provides methods that apply to the extra-ordinary Hall effect which can significantly reduce the difficulty to measure the hysteresis curves and anisotropic energy.

The conventional method can only measure the anisotropic energy of a single-layer material, however, if a magnetic structure consists of a plurality of magnetic materials, the conventional method fails to obtain the anisotropic energy of every magnetic material therein.

This other shortcoming for the conventional method is especially problematic for magnetic devices consisting of multi-film layers of various materials.

SUMMARY

In order to solve the aforementioned and other problems and to achieve the technical advantages of the present invention, the present invention provides a method for measuring hysteresis curve and anisotropic energy of a magnetic memory unit. The method can measure the anisotropic energy for a magnetic structure, even if the structure is consisting of a plurality of materials.

Therefore, an objective of the present invention is to provide a method for measuring the anisotropic energy of magnetic materials, which applies different step-by-step external magnetic fields and, records the difference of coercive fields in each step, and then an appropriate software is applied to calculate the anisotropic energy of each material.

According to the aforementioned objectives of the present invention, a method of measuring the anisotropic energy of a magnetic structure with a plurality of layers is provided. The method includes applying the extra ordinary Hall effect. A Hall voltage is obtained by applying an external magnetic field to magnetic material with a perpendicular magnetization rotating from the normal direction. This phenomenon is called the "extra-ordinary Hall effect" as the Hall voltage obtained by the method of the present invention is different from the ordinary Hall voltage. An ordinary Hall voltage is generated when the electrons and the electronic holes are distributed to the opposite sides of the material with a current passing through the material.

The different coercive field intensities of different magnetic materials are obtained through the following steps:

1. Apply an external magnetic field to induce the net magnetization of the magnetic materials to align completely in the same direction.

2. Apply an external magnetic field that is either parallel or antiparallel to the coercive field of each step by step magnetic material, wherein the intensity of the external magnetic field is slightly greater than the coercive field of each magnetic material.

After that, external magnetic field gradient perpendicular to the coercive field of each magnetic material is applied step by step, wherein the intensity of the external magnetic field gradient is much greater than the coercive field of each magnetic material, such that the variation between the coercive field intensity and the anisotropic energy is recorded step by step.

The external magnetic field generates the net magnetization for each specific magnetic material of a magnetic structure, with an opposite direction to other magnetic materials. The method applies the external magnetic field gradient that is perpendicular to the coercive field of each magnetic material step by step, wherein the intensity of the external magnetic field gradient is slightly greater than the coercive field of each magnetic material, the variations of coercive field intensity and anisotropic energy are recorded, and then the calculation for the anisotropic energy of the specific magnetic material is performed.

The present invention applies vector relations to obtain the cumulative equations of anisotropic energy from each magnetic material in the external magnetic field gradient. The value of anisotropic energy of every magnetic material is obtained by vector analysis. The present invention is suitable for all kinds of horizontally or perpendicularly anisotropic magnetic structures or materials.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
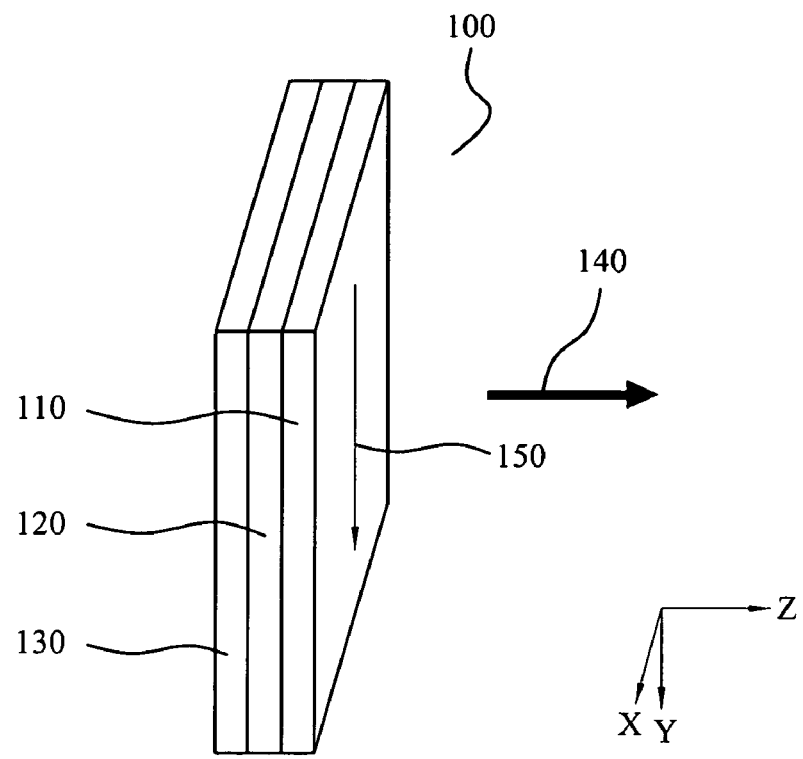
FIG. 1 illustrates a method for measuring hysteresis curve of a magnetic structure comprising a single-layer magnetic material with the extra ordinary Hall effect.

Reference is now made in detail to the present preferred embodiments of the invention, examples of which are illustrated in the accompanying drawings. Wherever possible, the same reference numbers are used in the drawings and the description to refer to the same or like parts.

While the specification concludes with claims defining the features of the invention that are regarded as novel, it is believed that the invention is better understood after considering the following description in conjunction with the figures, in which like reference numerals are carried forward.

Reference is made to FIG. 1, which illustrates a method for measuring the hysteresis curve of a magnetic structure comprising a single-layer magnetic material with the extra-ordinary Hall effect. A magnetic device 100 includes an upper protective layer 110, a magnetic layer 120 and a lower protective layer 130.

The material of the magnetic layer 120 is a perpendicularly anisotropic magnetic material, such as GdFeCo, TbFeCo or DyFeCo. Applying a magnetic field 140 in the Z-axis direction of the magnetic device 100 enables the net magnetization of the magnetic layer 120 to rotate in the same direction. Applying a current 150 and changing the intensity of the magnetic field 140, the variations in the Hall voltage value are generated. (A coordinate axis illustrated in FIG. 1, which shows the direction of X-axis, Y-axis and Z-axis).

Figure 2:
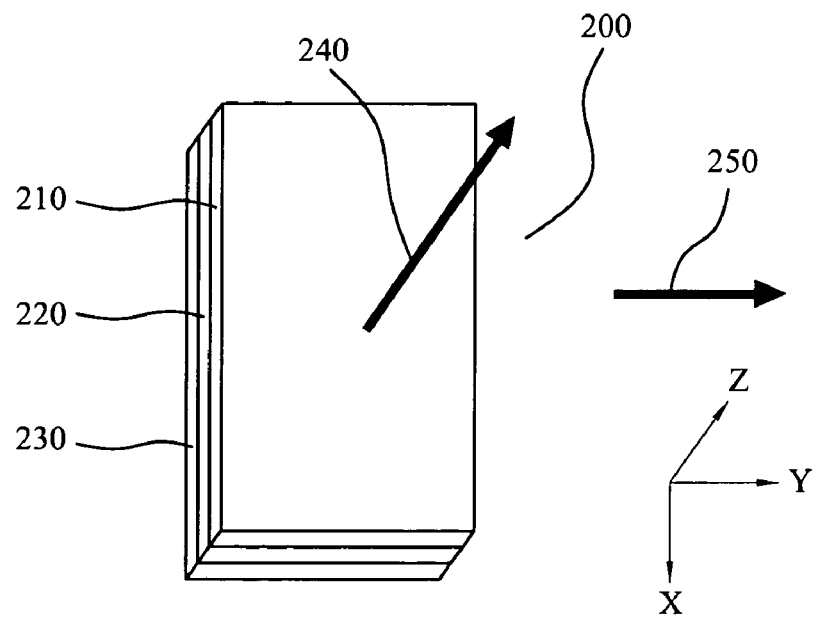
FIG. 2 illustrates a method for measuring anisotropic energy of a magnetic structure comprising a single-layer magnetic material with the extra ordinary Hall effect.

Reference is made to FIG. 2, which illustrates a method for measuring anisotropic energy of a magnetic structure comprising a single-layer magnetic material with the extra ordinary Hall effect. A magnetic component 200 consists of an upper protective layer 210, a magnetic layer 220 and a lower protective layer 230.

Applying a magnetic field 240 along with the Z-axis of the magnetic component 200 enables the net magnetization of the magnetic layer 220 to rotate in the same direction. A magnetic field 250 is applied in the Y-axis direction of the magnetic component 200; the intensity of the magnetic field 250 is slightly greater than coercive field of the magnetic layer 220. Hence, an anisotropic energy curve of the magnetic layer 220 can be obtained, and an anisotropic energy value could be calculated through appropriate software. (A coordinate axis illustrated in FIG. 2 shows the direction of the X-axis, Y-axis and Z-axis).

Figure 3:
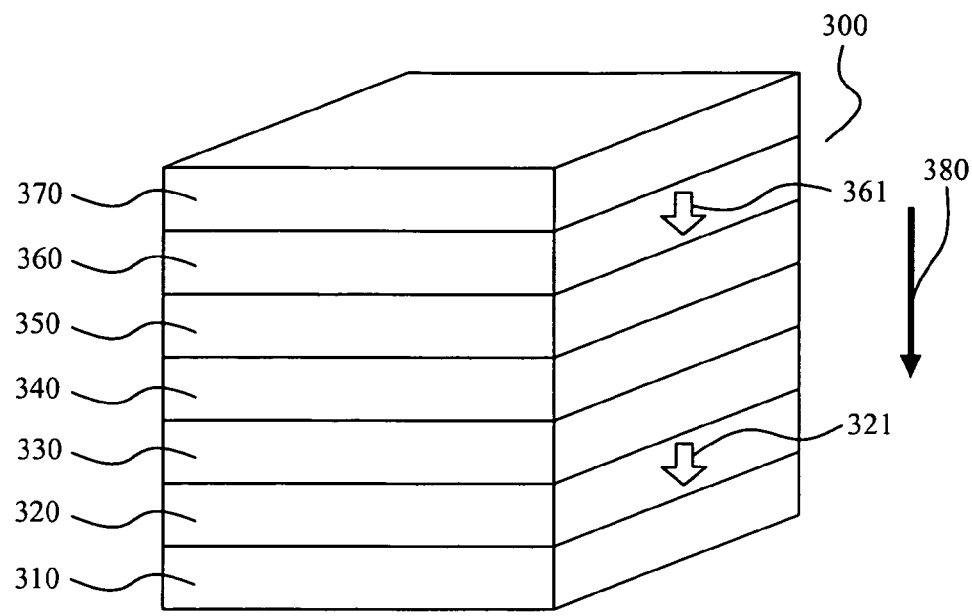
FIGS. 3 through 6 illustrate of the first through fourth phases of an anisotropic energy measuring method of the preferred embodiment of the present invention.

Reference is made to FIG. 3, which illustrates the first phase of an anisotropic energy measuring method for the preferred embodiment of the present invention. A magnetic device 300 is a multilayer magnetic structure, which includes a lower electrode layer 310, a first main magnetic layer 320, a first sub magnetic layer 330, an oxide layer 340, a second sub magnetic layer 350, a second main magnetic layer 360 and an upper electrode layer 370.

In this embodiment, the magnetic device 300 is a magnetic tunneling junction (MTJ) of a magnetic memory unit. The net magnetization of the first main magnetic layer 320 and the second main magnetic layer 360 are stronger than the other layers. The first main magnetic layer 320 is a free layer of the MTJ, and the second main magnetic layer 360 is a pinned layer of the MTJ.

The material of the first main magnetic layer 320 could be GdFeCo, TbFeCo or DyFeCo. In this embodiment, the material of the first main magnetic layer 320 is GdFeCo. The first main magnetic layer 320 includes a net magnetization 321, and the direction of the net magnetization 321 can be changed easily by an external magnetic field. The material of the second main magnetic layer 360 could be GdFeCo, TbFeCo or DyFeCo. In this embodiment, the material of the second main magnetic layer 360 is TbFeCo. The second main magnetic layer 360 includes a net magnetization 361, and the net magnetization 361 is perpendicularly anisotropic. The coercive field of the second main magnetic layer 360 is greater than the one on the first main magnetic layer 320.

Applying a perpendicularly downward magnetic field 380 to the magnetic device 300 enables the net magnetization 321 and the net magnetization 361 to be aligned in the same direction.

Figure 4:
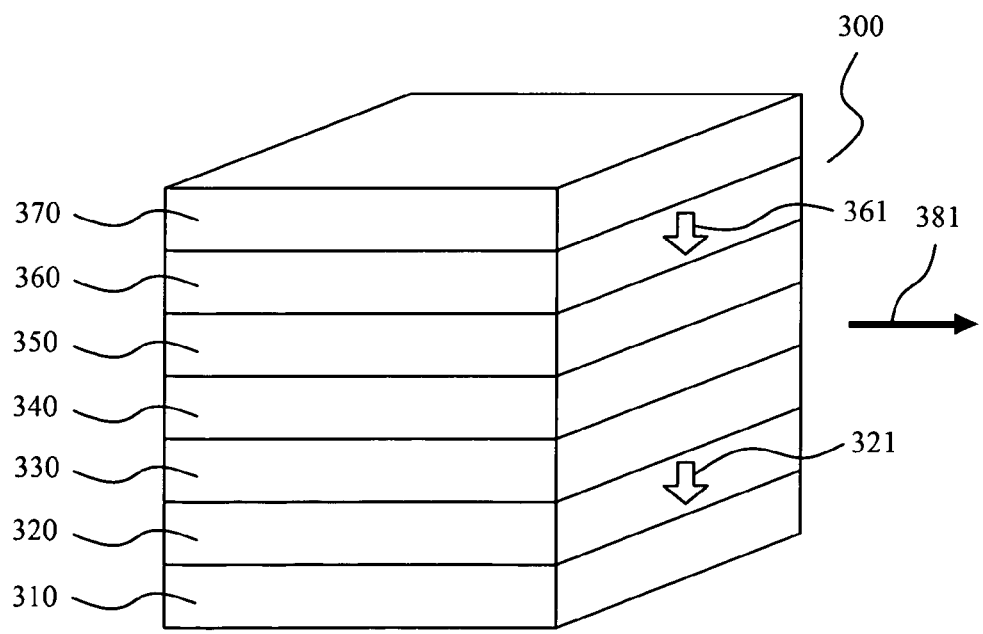

Reference is made to FIG. 4, which illustrates the second phase of an anisotropic energy measuring method of the preferred embodiment of the present invention. A horizontal magnetic field 381 is applied to the magnetic device 300, and the intensity of the horizontal magnetic field 381 has to be slightly greater than the coercive field of the first main magnetic layer 320 but smaller than the coercive field of the second main magnetic layer 360. A cumulative function of the anisotropic energy of the first main magnetic layer 320 and the second main magnetic layer 360 can be calculated through appropriate software as described by the following equation:

$$Ku_A = Ku_{320} + Ku_{360}$$

Under the horizontal magnetic field 381, $Ku_A$ is the cumulative anisotropic energy of the first main magnetic layer 320 and the second main magnetic layer 360. $Ku_{320}$ is the anisotropic energy of the first main magnetic layer 320, and $Ku_{360}$ is the anisotropic energy of the second main magnetic layer 360.

Figure 5:
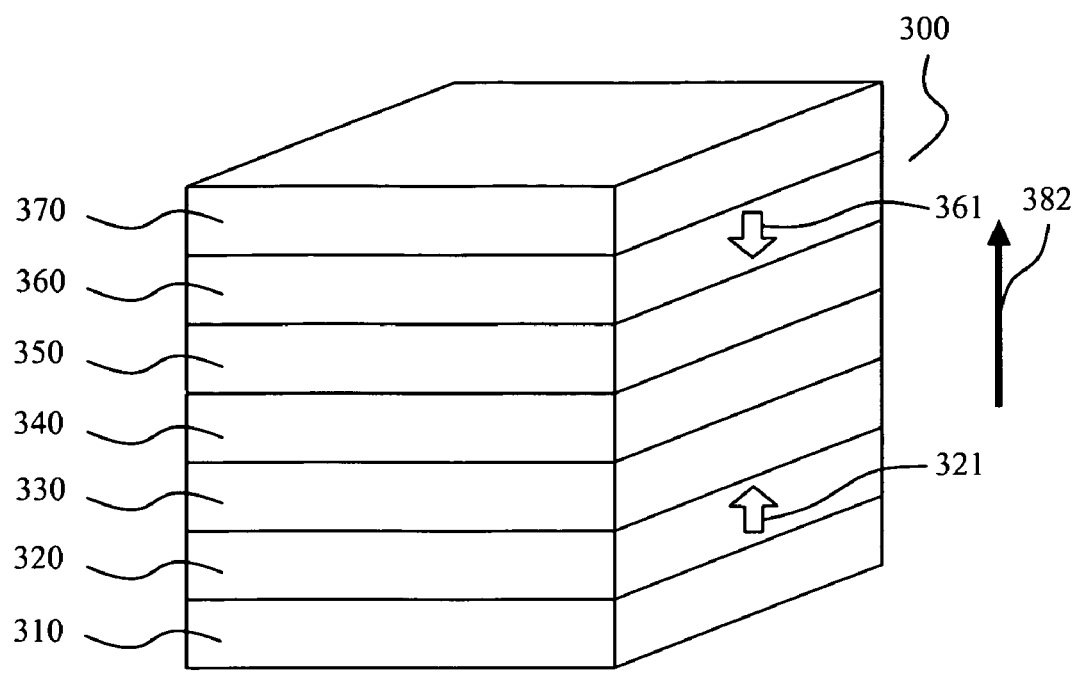

Reference is made to FIG. 5, which illustrates the third phase of an anisotropic energy measuring method of the preferred embodiment of the present invention. A perpendicularly upward magnetic field 382 is applied to the magnetic device 300, then the net magnetization 321 and the net magnetization 361 become antiparallel.

Figure 6:
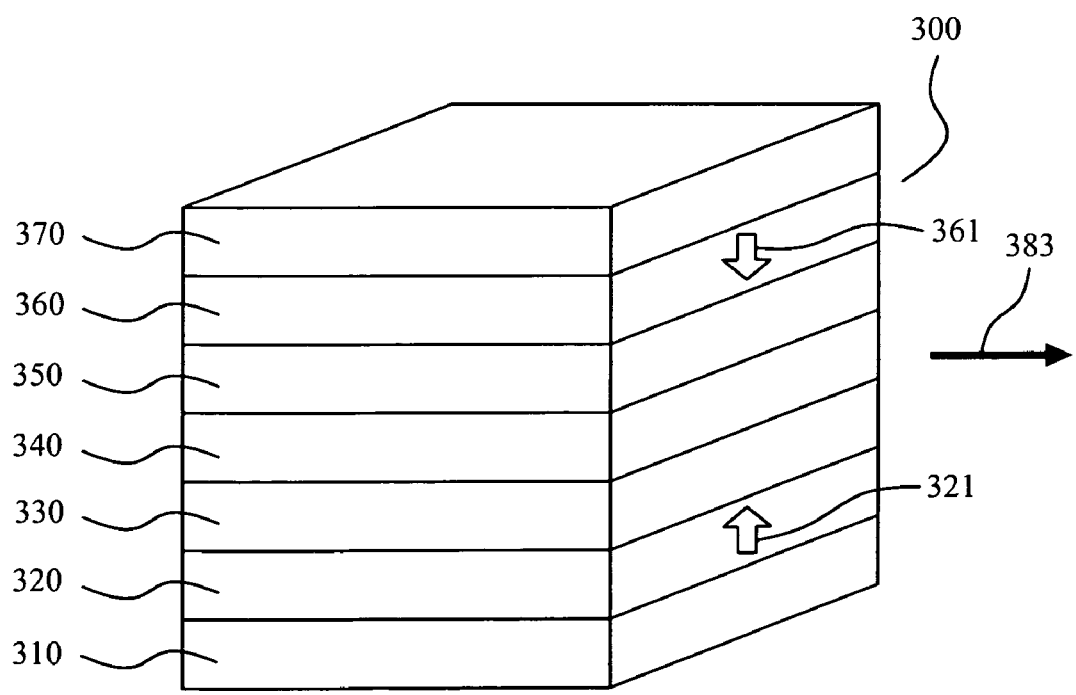

Reference is made to FIG. 6, which illustrates the fourth phase of an anisotropic energy measuring method of the preferred embodiment of the present invention. A horizontal magnetic field 383 is applied to the magnetic device 300, and the intensity of the horizontal magnetic field 383 must be slightly greater than the coercive field of the first main magnetic layer 320 but smaller than the coercive field of the second main magnetic layer 360. A cumulative function of the anisotropic energy of the first main magnetic layer 320 and the second main magnetic layer 360 can be calculate through appropriate software as described by the following equation:

$$Ku_B = -Ku_{320} + Ku_{360}$$

A third equation below can be further obtained from the aforementioned first equation and the second equation:

$$Ku_{320} = (Ku_A - Ku_B)/2$$

Under the horizontal magnetic field 383, $Ku_B$ is the cumulative anisotropic energy of the first main magnetic layer 320 and the second main magnetic layer 360. $Ku_{320}$ is the anisotropic energy of the first main magnetic layer 320, and $Ku_{360}$ is the anisotropic energy of the second main magnetic layer 360.

Because all of the aforementioned magnetic fields are smaller than the coercive field of the second main magnetic layer 360, the complete function of anisotropic energy of the second main magnetic layer 360 cannot be obtained. Hence, the second and third phases above are repeated, except that the intensity of the magnetic field is made to be much greater than the coercive field of the first main magnetic layer 320 and the second main magnetic layer 360. Then, the complete function of anisotropic energy of the second main magnetic layer 360 can be obtained.

From the first, second and third equations, the anisotropic energy of the second main layer 360 can be shown as a fourth equation below:

$$Ku_{360} = (Ku_A + Ku_B)/2$$

Under the intensity of the magnetic field which is much greater than the coercive field of the first main magnetic layer 320 and the second main magnetic layer 360, $Ku_A$ is the cumulative anisotropic energy of the first main magnetic layer 320 and the second main magnetic layer 360, whose net magnetization 320 and 360 are parallel. $Ku_B$ is the cumulative anisotropic energy of the first main magnetic layer 320 and the second main magnetic layer 360, while the net magnetization 320 and 360 are antiparallel. $Ku_{360}$ is the anisotropic energy of the second main magnetic layer 360. Thus, the specific anisotropic energy of both the first main magnetic layer 320 and the second main magnetic layer 360 can be obtained.

The arrangement of the aforementioned anisotropic energy measuring method of the magnetic memory unit is as follows:

The magnetic memory unit includes the first main magnetic layer as a free layer and the second main magnetic layer as a pinned layer. Applying the perpendicularly downward magnetic field to the magnetic memory unit makes that the multiple net magnetizations of the first main magnetic layer and the second main magnetic layer turn totally downward. After that, the horizontal magnetic field is applied to the magnetic memory unit. The intensity of the horizontal external magnetic field is slightly greater than the coercive field of the first main magnetic layer but it is smaller than the coercive field of the second main magnetic layer. From this, the cumulative function of the anisotropic energy of the first main magnetic layer and the second main magnetic layer can be obtained to define a first equation by software calculation.

After removing the external magnetic field of the previous phase, a perpendicularly upward magnetic field is applied to the magnetic memory unit. The perpendicularly upward magnetic field makes the net magnetizations of the first main magnetic layer and the second main magnetic layer become antiparallel. A horizontal magnetic field is then applied to the magnetic memory unit. The intensity of this horizontal magnetic field is slightly greater than the coercive field of first main magnetic layer and smaller than the coercive field of the second main magnetic layer. From this, the cumulative function of the anisotropic energy of the first main magnetic layer and the second main magnetic layer can be obtained to define a second equation by software calculation. The anisotropic energy of the first main magnetic layer can be calculated from the first equation and the second equation.

After removing the external magnetic field of the previous phase, a perpendicularly downward magnetic field is applied to the magnetic memory unit. The perpendicularly downward magnetic field enables the net magnetizations of the first main magnetic layer and the second main magnetic layer both turning downward. Then, a horizontal magnetic field is applied to the magnetic memory unit. The intensity of this horizontal magnetic field is much greater than the coercive fields of the first main magnetic layer and the second main magnetic layer. From this, the cumulative function of the anisotropic energy of the first main magnetic layer and the second main magnetic layer can be obtained to define a third equation by software calculation.

After removing the external magnetic field of the previous phase, a perpendicularly upward external magnetic field is applied to the magnetic memory unit. The perpendicularly upward magnetic field makes the net magnetizations of the first main magnetic layer and the second main magnetic layer become antiparallel. Then, a horizontal magnetic field is applied to the magnetic memory unit whose intensity is much greater than the coercive fields of first main magnetic layer and the second main magnetic layer. Then, the cumulative function of the anisotropic energy of the first main magnetic layer and the second main magnetic layer is obtained to interpret a fourth equation through an appropriate software. The anisotropic energy of the second main magnetic layer can be calculated through the third equation and the fourth equation.

Figure 7:
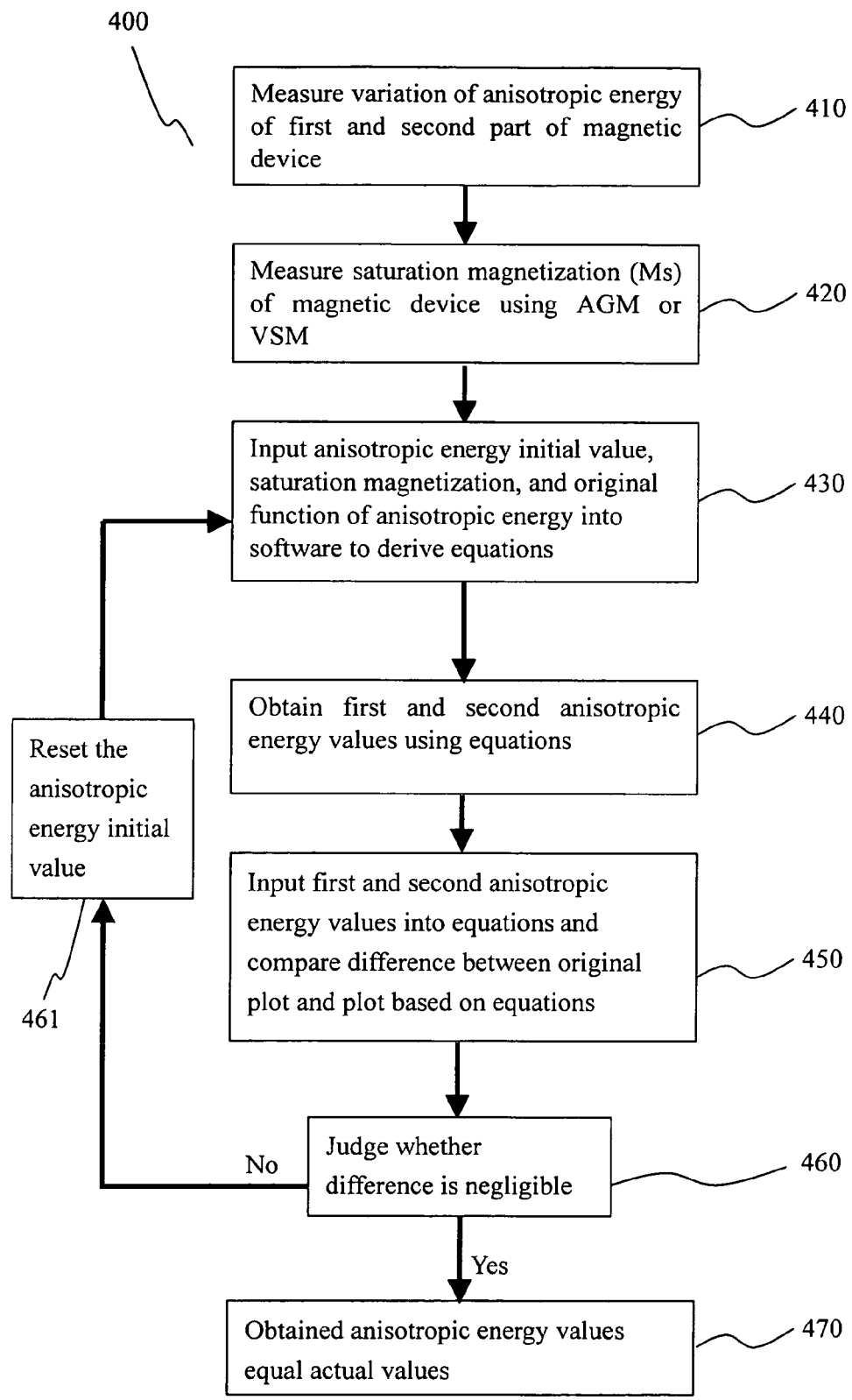
FIG. 7 illustrates the flowchart of a software calculation process for the preferred embodiment of the present invention.

Reference is made to FIG. 7, which illustrates the flow chart of the software calculation process of the preferred embodiment of the present invention. The flow chart of the software calculation process 400 includes many steps for calculating the value of the anisotropic energy. A step 410 describes the measurement for the variation of anisotropic energy in the first and second part of the magnetic device. A step 420 describes the measurement for saturation magnetization ($M_s$) of a magnetic device by applying AGM or VSM. A step 430 describes the inputs of the initial value for the anisotropic energy, saturation magnetization, and original function of anisotropic energy for performing software. A step 440 obtains a first and a second anisotropic energy values using the aforementioned first, second, third and fourth equations. A step 450 describes the inputs of the first and the second anisotropic energy value for equations (namely the aforementioned first, the second, the third and the fourth equations) and compares the differences between the original plot and the plot based on equations. A step 460 provides the decisions whether the difference is negligible in the step 450 is substantially equivalent. If the results from the step 450, which are not equivalent, a step 461 is processed to change the anisotropic energy initial value and return to the step 430 to feed in data again. If the result from the step 450 is substantially equivalent, then a step 470 enables the calculation for the anisotropic energy value, and the anisotropic energy value will be for the magnetic device.

The arrangement of the steps of the software calculation are listed as follows:

Instruments like AGM or VSM are applied to measure the first main magnetic layer and the second main magnetic layer, which can obtain the saturation magnetization ($M_S$) and the original function of anisotropic energy. The saturation magnetization, the original function of anisotropic energy, and the initial value of anisotropic energy are inputs into the software program and the previously derived equations (namely the aforementioned first, second, third and fourth equations) are used to calculate the values of the first anisotropic energy and the second anisotropic energy.

The values of the first anisotropic energy and the second anisotropic energy are input into the previously derived equations (namely the aforementioned first, second, third and fourth equations), then the original plot and the plot according to the previously derived equations are compared to determine equivalency. If the two plots are not equivalent, the anisotropic energy initial value is changed and the anisotropic energy is calculated again. If the results are substantially equivalent, the calculated first and second anisotropic energy value is namely the anisotropic energy value of the first main magnetic layer and the second main magnetic layer, respectively.

According to the composition and the embodiments above, there are many advantages of the present invention over the prior art, such as:

1. When the magnetic device consists of a plurality of magnetic materials, no matter whether the easy axes of the magnetic materials are horizontally or perpendicularly anisotropic, this measuring method of the present invention can obtain the anisotropic energy of each magnetic material.

2. The interaction among the magnetic materials can be comprehensively to facilitate the magnetization obtaining a magnetic device with better physical characteristics by stepwise when modifying the features of these magnetic materials such as the thickness and composition.

It will be apparent to those skilled in the art that various modifications and variations can be made to the structure of the present invention without departing from the scope or spirit of the invention. In view of the foregoing, it is intended that the present invention covers the modifications and variations of this invention, provided they fall within the scope of the following claims and their equivalents.

What is claimed is:

1. A method for measuring hysteresis curve of a magnetic structure comprising a single-layer magnetic material, comprising:
   (a) applying an external magnetic field perpendicular to the surface of the magnetic structure, wherein enables a net magnetization of the magnetic structure turning perpendicularly to the surface;
   (b) passing through a current to the surface of the magnetic structure, wherein a forward direction of the current is perpendicular to the external perpendicular magnetic field, and parallel to the surface of the magnetic structure; and
   (c) varying the intensity of the external perpendicular magnetic field continuously to obtain variations of Hall voltage value from one direction, and illustrating a hysteresis curve of the magnetic structure; wherein the direction is perpendicular to the external magnetic field in step (a), and perpendicular to the forward direction of the current in step (b).

2. The method of claim 1, wherein the magnetic structure comprises an upper protective layer, a magnetic layer and a lower protective layer.

3. The method of claim 2, wherein the magnetic layer comprises perpendicularly anisotropic magnetizations.

4. The method of claim 2, wherein the magnetic layer is GdFeCo.

5. A method for measuring anisotropic energy of a magnetic structure comprises a single-layer magnetic material, comprising:
   (a) applying a first magnetic field perpendicular to a surface of the magnetic structure to enables a net magnetization of the magnetic structure turning perpendicularly to the surface; the magnetic structure comprises an upper protective layer, a magnetic layer and a lower protective layer;
   (b) applying a second magnetic field parallel to the magnetic layer, wherein an intensity of the second magnetic field is slightly greater than a coercive field of the magnetic layer; and
   (c) recording an anisotropic energy curve, and using an appropriate software to calculate an anisotropic energy value.

6. The method of claim 5, wherein the magnetic layer comprises perpendicularly anisotropic magnetizations.

7. The method of claim 6, wherein the magnetic layer is GdFeCo.

8. The method of claim 6, wherein the magnetic layer is TbFeCo.

9. The method of claim 6, wherein the magnetic layer is DyFeCo.

10. A method for measuring anisotropic energy of a magnetic memory unit, wherein the magnetic memory unit comprises at least one first main magnetic layer and at least one second main magnetic layer, comprising:
   (a) applying a perpendicular downward magnetic field to the magnetic memory unit, which enables a plurality of net magnetizations of the first main magnetic layer and the second main magnetic layer all rotating downward;
   (b) applying a horizontal magnetic field to the magnetic memory unit whose intensity is slightly greater than the coercive field of the first main magnetic layer but smaller than the coercive field of the second main magnetic layer, and a cumulative function of the anisotropic energy of the first main magnetic layer and the second main magnetic layer can be obtained to acquire a first equation by applying an appropriate software;
   (c) applying a perpendicular upward magnetic field to the magnetic memory unit, which makes the plurality of net magnetizations with opposite directions for the first main magnetic layer and the second main magnetic layer;
   (d) applying a horizontal magnetic field to the magnetic memory unit wherein intensity is slightly greater than the coercive field of the first main magnetic layer but smaller than the coercive field of the second main magnetic layer, and a cumulative function of the anisotropic energy of the first main magnetic layer and the second main magnetic layer can be obtained to acquire a second equation by applying an appropriate software;
   (e) deriving an anisotropic energy of the first main magnetic layer by applying the first equation and the second equation;
   (f) applying a perpendicular downward magnetic field to the magnetic memory unit, which enables a plurality of net magnetizations of the first main magnetic layer and the second main magnetic layer all rotating downward;
   (g) applying a horizontal magnetic field to the magnetic memory unit whose intensity is much greater than the coercive field of the first main magnetic layer and the second main magnetic layer, and a cumulative function of the anisotropic energy of the first main magnetic layer and the second main magnetic layer can be obtained to acquire a third equation with the software;

(h) applying a perpendicular downward magnetic field to the magnetic memory unit, which enables the plurality of net magnetizations included by the first main magnetic layer and the second main magnetic layer have opposite directions;

(i) applying a horizontal magnetic field to the magnetic memory unit whose intensity must be much greater than the coercive field of the first main magnetic layer and the second main magnetic layer, and a cumulative function of the anisotropic energy of the first main magnetic layer and the second main magnetic layer can be obtained to acquire a fourth equation by software calculating; and (j) deriving an anisotropic energy of the second main magnetic layer via calculation of the third equation and the fourth equation.

11. The method of claim 10, wherein a magnetization of the first main magnetic layer in the step (a) is perpendicularly anisotropic.

12. The method of claim 10, wherein a magnetization of the first main magnetic layer in step (a) is horizontal anisotropic.

13. The method of claim 10, wherein the material of the first main magnetic layer in step (a) is GdFeCo.

14. The method of claim 10, wherein a magnetization of the second main magnetic layer in step (a) is perpendicularly anisotropic.

15. The method of claim 10, wherein a magnetization of the second main magnetic layer in the (a) is horizontal anisotropic.

16. The method of claim 10, wherein the material of the second main magnetic layer in step (a) is TbFeCo.

17. The method of claim 10, wherein the software calculation process in step (b) comprises:

(a) using an instrument to measure a saturation magnetization and an original function of the anisotropic energy;

(b) inputting the saturation magnetization, the original function of the anisotropic energy above and a set of anisotropic energy initial values into the software;

(c) using the previously derived equations of the anisotropic energy to calculate a first anisotropic energy value and a second anisotropic energy value;

(d) inputting the first and second anisotropic energy values into the previously derived equations; and (e) comparing the equivalence of an original plot and a plot by the previously derived equations, wherein if the comparison is not equivalent, the initial anisotropic energy value is reset and the calculation returns to the step (a), if the comparison is equivalent, the values of the first and the second anisotropic energy are the anisotropic energy values of the first and second main magnetic layers, respectively.

18. The method of claim 17, wherein the instrument in the step (a) is an alternating gradient magnetometer (AGM).

19. The method of claim 17, wherein the instrument in the step (a) is a vibrating sample magnetometer (VSM).

* * * * *